US 8,816,774 B2

(12) United States Patent
Shinichi et al.

(10) Patent No.: US 8,816,774 B2
(45) Date of Patent: Aug. 26, 2014

(54) POWER AMPLIFIER SYSTEM

(75) Inventors: Iizuka Shinichi, Gyeonggi-do (KR); Sang Hoon Ha, Gyeonggi-do (KR); Jun Kyung Na, Gyeonggi-do (KR)

(73) Assignee: Samsung Electro-Mechanics Co., Ltd., Suwon (KR)

(*) Notice: Subject to any disclaimer, the term of this patent is extended or adjusted under 35 U.S.C. 154(b) by 39 days.

(21) Appl. No.: 13/595,449

(22) Filed: Aug. 27, 2012

(65) Prior Publication Data
US 2013/0049872 A1 Feb. 28, 2013

(30) Foreign Application Priority Data

Aug. 31, 2011 (KR) .................. 10-2011-0087989

(51) Int. Cl.
*H03F 3/21* (2006.01)

(52) U.S. Cl.
USPC .................................. 330/296; 330/285

(58) Field of Classification Search
USPC ............. 330/285, 296–298, 207 P, 311, 273
See application file for complete search history.

(56) References Cited

U.S. PATENT DOCUMENTS 8,319,559 B2 * 11/2012 Kocer et al. .................. 330/296

FOREIGN PATENT DOCUMENTS

KR    2000-0020104    4/2000

* cited by examiner

*Primary Examiner* — Hieu Nguyen

(57) ABSTRACT

Disclosed herein is a power amplifier system including: a power amplifier; a power controlling unit providing driving voltage and driving current corresponding to a preset reference voltage to the power amplifier; a current controlling unit performing a control so that control current corresponding to applied control voltage flows; a bias controlling unit detecting current and voltage corresponding to the driving current of the power controlling unit and controlling bias current of the power amplifier according to the detected voltage; and a current adjusting unit detecting bias voltage corresponding to the bias current of the power amplifier and adjusting the driving current of the power controlling unit according to the detected bias voltage. Even though applied control voltage increases, current applied to the power amplifier is appropriately adjusted, thereby making it possible to improve characteristics of the power amplifier.

11 Claims, 3 Drawing Sheets

POWER AMPLIFIER SYSTEM

CROSS REFERENCE(S) TO RELATED APPLICATIONS

This application claims the benefit under 35 U.S.C. Section 119 of Korean Patent Application Serial No. 10-2011-0087989, entitled "Power Amplifier System" filed on Aug. 31, 2011, which is hereby incorporated by reference in its entirety into this application.

BACKGROUND OF THE INVENTION

1. Technical Field

The present invention relates to a power amplifier system, and more particularly, to a power amplifier system capable of stably supplying current a power amplifier.

2. Description of the Related Art

Generally, a power amplifier is used in order to transmit and receive a signal in a wireless communication system such as a mobile communication terminal. Here, the power amplifier indicates a device amplifying a small signal efficient into a large signal having low distortion to supply the amplified signal to a load through an antenna.

As this power amplifier, a complementary metal oxide semiconductor (CMOS) power amplifier designed by a general CMOS process in a Gallium Arsenide (GaAs) process that is a process of manufacturing a special semiconductor is used. Since the CMOS power amplifier as described above may be mass-produced, it has advantages such as a cheap cost and various functions.

Meanwhile, in order to stably control an operation of the power amplifier, a power adjuster has been developed, and a technology for supplying stable power to the power amplifier using the power adjuster has been studied and developed.

A power amplifier system according to the related art using the power adjuster includes a voltage controller providing constant voltage corresponding to reference voltage to a power amplifier, a current controller adjusting driving current according to input control voltage, and a bias controller controlling bias current applied to the power amplifier using the driving voltage and the driving current, and appropriately adjusts the bias current according to the input control voltage to supply stable current to the power amplifier.

However, as the input control voltage increases, the bias current applied to the power amplifier also increases, and when a magnitude of the bias current applied to the power amplifier is out of a predetermined range, the bias controller does not appropriately control the bias current.

In order to solve this problem, a scheme of inputting low control voltage to the power amplifier system has been used. However, a temporal time delay in which large bias current is applied to the power amplifier until the bias controller is normally operated by the low control voltage may be generated.

Therefore, characteristics of the power amplifier are deteriorated.

SUMMARY OF THE INVENTION

An object of the present invention is to provide a power amplifier system capable of improving characteristics of a power amplifier by appropriately adjusting current supplied to the power amplifier even though applied control voltage increases.

According to an exemplary embodiment of the present invention, there is provided a power amplifier system including: a power amplifier; a power controlling unit providing driving voltage and driving current corresponding to a preset reference voltage to the power amplifier; a current controlling unit performing a control so that control current corresponding to applied control voltage flows; a bias controlling unit detecting current and voltage corresponding to the driving current of the power controlling unit and controlling bias current of the power amplifier according to the detected voltage; and a current adjusting unit detecting bias voltage corresponding to the bias current of the power amplifier and adjusting the driving current of the power controlling unit according to the detected bias voltage.

The current adjusting unit may include: a voltage divider dividing the detected bias voltage; a current adjusting transistor operated according to the bias voltage divided in the voltage divider; and a current mirror generating mirror current that is the same as current flowing to the current adjusting transistor.

The bias controlling unit may detect the current and the voltage corresponding to the driving current of the power controlling unit and control the bias current so that the detected voltage becomes equal to the driving voltage.

The bias controlling unit may include: a detector detecting the current and the voltage corresponding to the driving current of the power controlling unit; a bias control amplifier comparing the driving voltage and the voltage detected in the detector with each other and outputting difference voltage between the driving voltage and the detected voltage as a result of the comparison; and first and second bias transistors operated according to the difference voltage output from the bias control amplifier.

The power controlling unit may include: a power control transistor having a source connected to a power supply terminal, a gate, and a drain connected to the current controlling unit; and a power control error amplifier including an inverting input terminal receiving the reference voltage, a non-inverting input terminal connected to the drain of the power control transistor through a first resistor and connected to a ground through a second resistor, and an output terminal connected to the gate of the power control transistor to provide gate voltage.

The bias voltage corresponding to the bias current of the power amplifier may be voltage applied to a connection node between the first and second bias transistors.

The current mirror may be connected between the current controlling unit and a ground.

The voltage divider may include: a first dividing resistor having one end connected to a connection node between the first and the second bias transistors; and a second dividing resistor having one end connected to the other end of the first dividing resistor and the other end connected to a ground.

The current adjusting transistor may have a gate connected to a connection node between the first and second dividing resistors, a source connected to the current mirror, and a drain connected to the ground.

The control current may be current corresponding to the sum of the driving current and the mirror current.

DESCRIPTION OF THE PREFERRED EMBODIMENTS

Terms and words used in the present specification and claims are not to be construed as a general or dictionary meaning but are to be construed meaning and concepts meeting the technical ideas of the present invention based on a principle that the inventors can appropriately define the concepts of terms in order to describe their own inventions in best mode.

Therefore, the configurations described in the exemplary embodiments and drawings of the present invention are merely most preferable embodiments but do not represent all of the technical spirit of the present invention. Thus, the present invention should be construed as including all the changes, equivalents, and substitutions included in the spirit and scope of the present invention at the time of filing this application.

Hereinafter, exemplary embodiments of the present invention will be described in detail with reference to the accompanying drawings.

Figure 1:
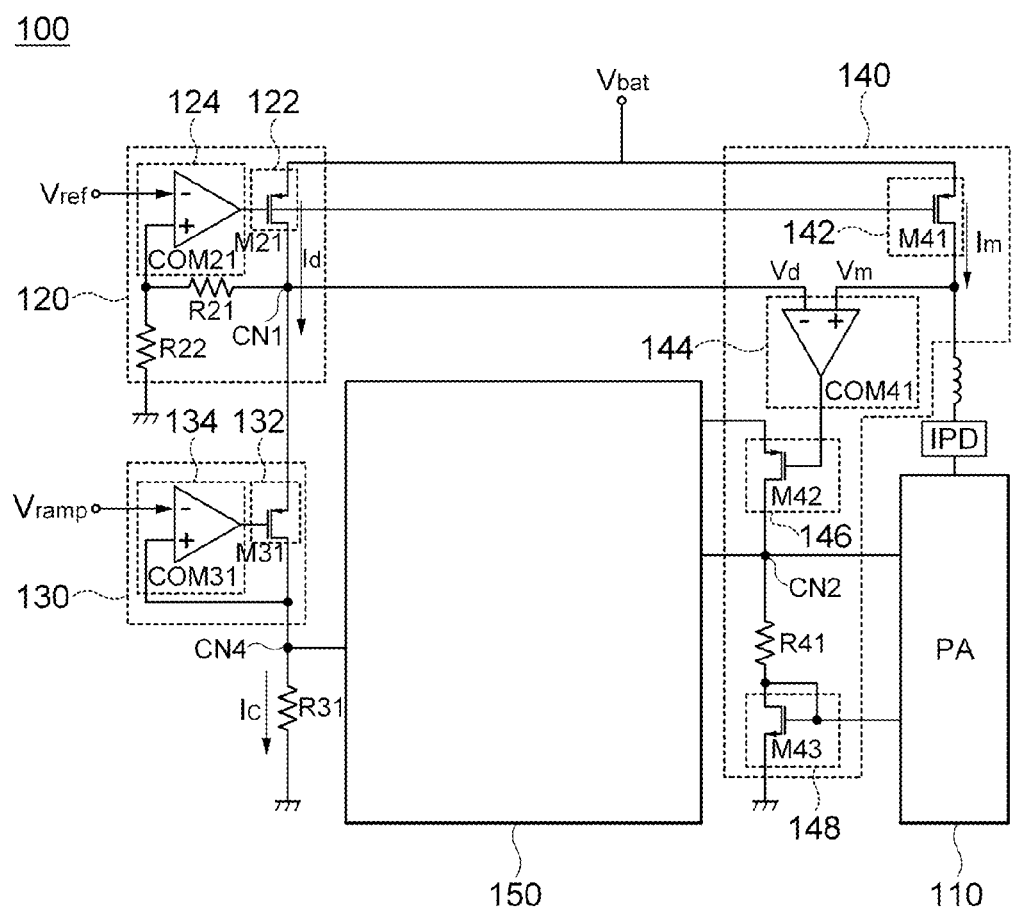
FIG. 1 is a schematic configuration diagram of a power amplifier system according to an exemplary embodiment of the present invention.
Figure 2:
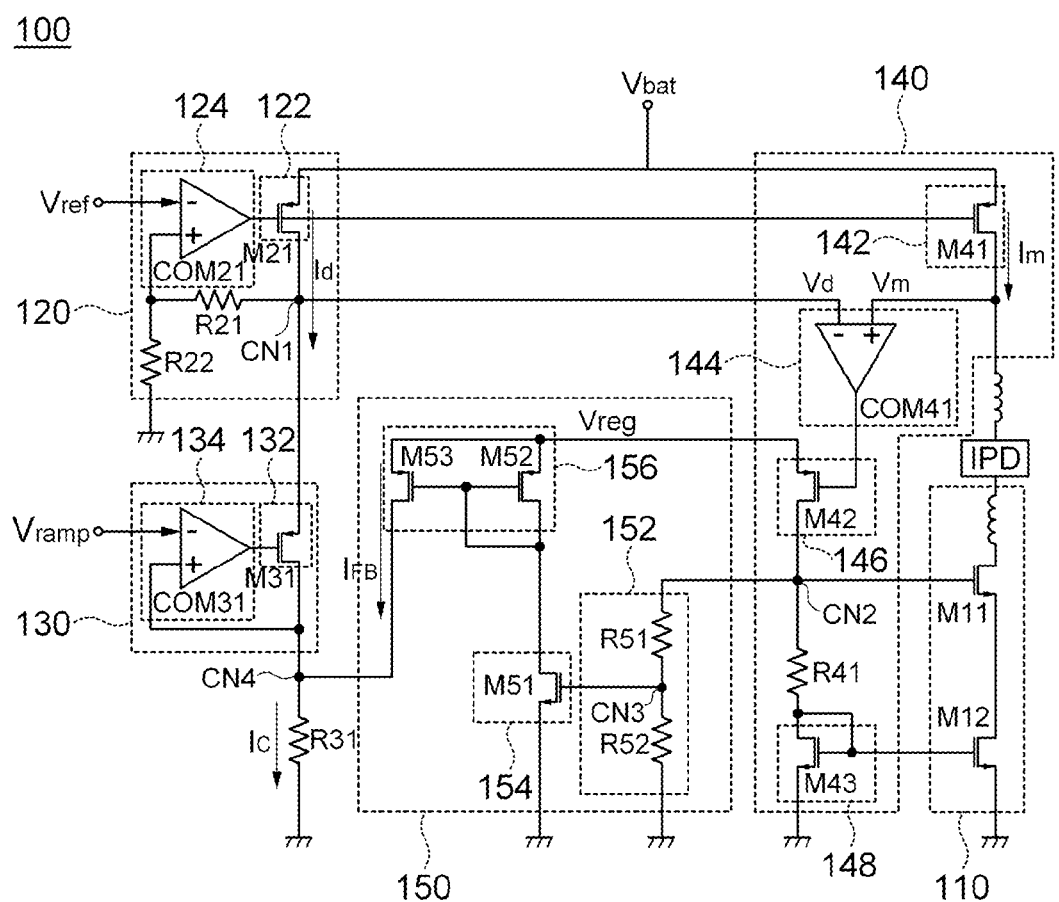
FIG. 2 is a detailed circuit diagram of the power amplifier system shown in FIG. 1.

FIG. 1 is a schematic configuration diagram of a power amplifier system according to an exemplary embodiment of the present invention; and FIG. 2 is a detailed circuit diagram of the power amplifier system shown in FIG. 1.

As shown in FIGS. 1 and 2, the power amplifier system 100 is configured to include a power amplifier 110, a power controlling unit 120, a current controlling unit 130, a bias controlling unit 140, and a current adjusting unit 150.

The power amplifier 110, which is a unit amplifying a signal input through an input terminal to output the amplified signal through an output terminal, may include two transistors M11 and M12 connected to each other in a cascade structure.

The power controlling unit 120, which is a unit providing driving voltage Vd and driving current Id corresponding to a preset reference voltage Vref to the power amplifier 110, may include a power control transistor 122 and a power control error amplifier 124.

Here, the power control transistor 122 may include a first PMOS FET M21 having a source connected to a power supply terminal Vbat, a gate, and a drain connected to the current controlling unit 130.

In addition, the power control error amplifier 124 may include a first OP AMP COM21 having an inverting (−) input terminal receiving the reference voltage Vref, a non-inverting (+) input terminal connected to the drain of the first PMOS FET M21 through a first resistor R21 and connected to a ground GND through a second resistor R22, and an output terminal connected to the gate of the first PMOS FET M21 to provide gate voltage.

Describing an operation process of the power controlling unit 120 as described above, the power control transistor 122 may provide the driving voltage Vd and the driving current Id adjusted according to the gate voltage of the first PMOS FET M21 to the power amplifier 110.

More specifically, the reference voltage Vref is input to the inverting input terminal of the power control error amplifier 124, that is, the first OP AMP COM21, voltage obtained by dividing voltage applied to a connection node CN1 between the drain of the first PMOS FET M21 and the first resistor R21 by the first and the second resistors R21 and R22 is input to the non-inverting input terminal of the first OP AMP COM21, and the gate voltage corresponding to difference voltage between the reference voltage Vref input to the inverting input terminal and the voltage input to the non-inverting input terminal is output to the output terminal to thereby be input to the gate of the first PMOS FET M21.

Therefore, the power control transistor 122 may provide the driving voltage Vd and the driving current Id adjusted according to the gate voltage to the power amplifier 110.

The current controlling unit 130, which is a unit allowing control current Ic corresponding to applied control voltage Vramp, may include a current control transistor 132 and a current control error amplifier 134. Here, the control voltage Vramp may be a preset power supply voltage. For example, in the case in which the power amplifier system is used in a transmission system, the control voltage Vramp may be set to voltage corresponding to the transmission power.

Here, the current control transistor 132 may include a second PMOS FET M31 having a source connected to the drain of the first PMOS FET M21, a gate, and a drain connected to the ground through a third resistor R31.

In addition, the current control error amplifier 134 may include a second OP AMP COM31 having an inverting (−) input terminal receiving the control voltage Vramp, a non-inverting (+) input terminal connected to the drain of the second PMOS FET M31, and an output terminal connected to the gate of the second PMOS FET M31 to provide gate voltage.

An operation process of the current controlling unit 130 as described above, may include the control voltage Vramp is input to the inverting input terminal of the second OP AMP COM31, voltage corresponding to current flowing through the drain of the second PMOS FET M31, that is, feedback voltage applied to the third resistor R31 is input to the non-inverting input terminal of the second OP AMP COM31, and the gate voltage corresponding to difference voltage between the control voltage Vramp input to the inverting input terminal and the feedback voltage input to the non-inverting input terminal is output to the output terminal to thereby be input to the gate of the second PMOS FET M31.

Therefore, the current controlling unit 130 controls current so that the feedback voltage becomes equal to the control voltage Vramp according to the gate voltage of the second PMOS FET M31, thereby allowing control current Ic corresponding to the control voltage Vramp to flow.

The bias controlling unit 140, which is a unit detecting current Im and voltage Vm corresponding to the driving current Id of the power controlling unit 120 and controlling bias current of the power amplifier 110 according to the detected current Im and voltage Vm, may include a detector 142, a bias control amplifier 144, and first and second bias transistors 146 and 148.

Here, the detector 142 may serve to detect the current Im and the voltage Vm corresponding to the driving current Id of the power controlling unit 120 and a third PMOS FET M41 forming a current mirror circuit with the first PMOS FET M21 to detect the current Im corresponding to the driving current Id flowing through the first PMOS FET M21.

For example, in the case in which the third PMOS FET M41 and the first PMOS FET M21 have a size (for example, a channel width) of 1000:1, the third PMOS FET M41 may detect the current Im corresponding to $1/1000$ of the driving current Id flowing through the first PMOS FET M21.

The bias control amplifier 144 may include a third OP AMP COM41 having an inverting (−) input terminal receiving the driving voltage Vd, a non-inverting (+) input terminal receiving the detected voltage Vm of the detector 142, and an output terminal connected to a gate of the first bias transistor 146 to provide gate voltage.

Each of the first and second bias transistors 146 and 148 may respectively include a fourth PMOS FET M42 and a fourth NMOS FET M43 that are operated according to the gate voltage provided from the output terminal of the third OP AMP COM41 and have a cascade structure.

Here, the fourth PMOS FET M42 may have a source connected to a regulated voltage source Vreg, a gate connected to the output terminal of the third OP AMP COM41, and a drain connected to a source of the fourth NMOS FET M43.

In addition, the fourth NMOS FET M43 may have the source connected to the drain of the fourth PMOS FET M42, a gate connected to a transistor M12 of the power amplifier 110, and a drain connected to the ground GND.

Describing an operation process of the bias controlling unit 140 as described above, the bias controlling unit 140 serves to control the bias current so that the driving voltage Vd becomes equal to the voltage Vm detected in the detector 142.

More specifically, when the detector 142 forms the current mirror circuit with the first PMOS FET M21 through the third PMOS FET M41 to detect the current Im and the voltage Vm corresponding to the driving current Id, the driving voltage Vd is input to the inverting input terminal of the third OP AMP COM41 and the detected voltage Vm is input to the non-inverting input terminal of the third OP AMP COM41, such that the driving voltage Vd and the detected voltage Vm are compared with each other and the gate voltage corresponding to difference voltage between the driving voltage Vd and the detected voltage Vm is output to the output terminal as a result of the comparison.

In this case, the gate voltage is applied to the fourth PMOS FET M42 and the fourth PMOS FET M42 is operated according to the gate voltage, such that current flowing from the source of the fourth NMOS FET M43 to the drain thereof is determined. Therefore, the bias current is controlled, thereby making it possible to determine the current flowing in the transistors M11 and M12 of the power amplifier 110 forming a current mirror structure.

The current adjusting unit 150, which is a unit detecting bias voltage Vb corresponding to the bias current of the power amplifier 110 and adjusting the driving current Id of the power controlling unit 120 according to the detected bias voltage Vb, may include a voltage divider 152, a current adjusting transistor 154, and a current mirror 156.

Here, the bias voltage Vb corresponding to the bias current of the power amplifier 110 means voltage applied to a connection node CN2 between the first and second bias transistors 146 and 148.

Here, the voltage divider 152 may serve to divide the bias voltage Vb corresponding to the bias current of the power amplifier 110 and may include a first dividing resistor R51 having one end connected to the connection node CN2 between the first and the second bias transistors 146 and 148 and a second dividing resistor R52 having one end connected to the other end of the first dividing resistor R51 and the other end connected to the ground GND.

In addition, the current adjusting transistor 154 may include a fifth NMOS FET M51 operated according to the bias voltage Vb divided by the first and second dividing resistors R51 and R52 and having a gate connected to a connection node CN3 between the first and second dividing resistors R51 and R52, a source connected to the current mirror 156, and a drain connected to the ground GND.

The current mirror 156, which is a unit generating mirror current $I_{FB}$ that is the same as current flowing from the source of the fifth NMOS FET M51 to the drain thereof, may be connected to a connection node CN4 between the current controlling unit 130 and the ground.

Describing an operation process of the current adjusting unit 150 as described above, the current adjusting unit 150 serves to appropriately adjust the current supplied to the power amplifier 110 even though the applied control voltage Vramp increases.

More specifically, when the bias voltage Vb is applied to the connection node CN2 between the first and second bias transistors 146 and 148, the voltage divider 152 divides the bias voltage Vb to apply the divided voltage to the gate of the fifth NMOS FET M51.

In this case, the fifth NMOS FET M51 is operated according to the divided bias voltage Vb applied to the gate thereof. That is, when the voltage applied to the gate becomes a predetermined voltage or more, the fifth NMOS FET M51 is conducted, such that current flows therein.

When the current flows in the fifth NMOS FET M51 due to the conduction of the fifth NMOS FET M51, the current is mirrored by the current mirror 156, such that the mirror current $I_{FB}$ that is the same as the current flowing to the fifth NMOS FET M51 flows to the connection node CN4 between the current controlling unit 130 and the ground.

Here, since the control current Ic flowing through the third resistor R31 is current corresponding to the sum of the driving current Id and the mirror current $I_{FB}$, when a magnitude of the mirror current $I_{FB}$ increases, a magnitude of the driving current Id decreases, thereby making it possible to stably control the current supplied to the power amplifier 110.

Hereinafter, an operation process and an acting effect of the power amplifier system according to the exemplary embodiment of the present invention will be described.

First, when the control voltage Vramp input to the current control error amplifier 134 increases, the driving current Id corresponding to the preset reference voltage Vref of the power controlling unit 120 also increases.

When the driving current Id increases as described above, the detected current Im corresponding to the driving current Id increases, and the voltage applied to the connection node CN2 between the first and second bias transistors 146 and 148 which is the bias voltage Vb of the power amplifier 110 by the increasing detected current Im.

In addition, when the voltage applied to the connection node CN2 between the first and second bias transistors 146 and 148 becomes a predetermined voltage or more, the current adjusting transistor 154 is operated, such that current of a predetermined current or more flows from the source of the current adjusting transistor 154 to the drain thereof, and the current mirror circuit is formed by the current mirror 156, such that the mirror current $I_{FB}$ flows to the connection node CN4 between the current controlling unit 130 and the ground.

Therefore, since the driving current Id is limited by the current flowing to the connection node CN4, the current applied to the power amplifier 110 may be limited to a predetermined current or less even though the applied control voltage Vramp increases.

Figure 3:
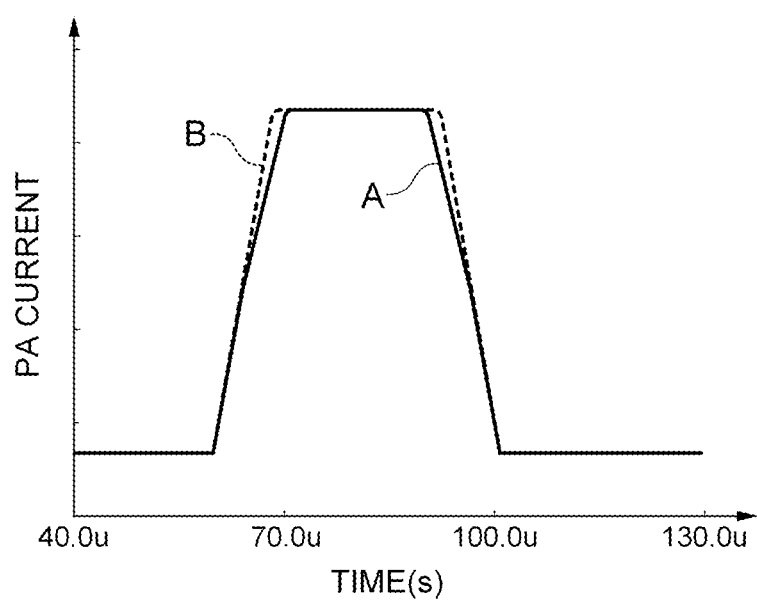
FIG. 3 is a graph showing current characteristics of the power amplifier system shown in FIG. 1.

FIG. 3 is a graph showing current characteristics of the power amplifier system shown in FIG. 1.

Referring to FIG. 3, it could be appreciated that a temporally generated time delay is decreased in current characteristics A of the power amplifier system according to the exemplary embodiment of the present invention as compared to current characteristics B of the power amplifier of the power amplifier system according to the related art.

That is, in the power amplifier system according to the exemplary embodiment of the present invention, in order to solve a temporal time delay generated due to an increase in the applied control voltage Vramp, the current adjusting unit is connected between the connection node between the current controlling unit and the ground and the bias controlling unit to appropriately limit the driving current even though the control voltage applied to the current controlling unit increases, thereby making it possible to stably control the current applied to the power amplifier.

Therefore, efficiency of the power amplifier system may be increased.

As set forth above, with the power amplifier system according to the embodiment of the present invention, even though the applied control voltage increases, the current applied to the power amplifier is appropriately adjusted, thereby making it possible to improve characteristics of the power amplifier.

More specifically, even though the applied control voltage increases, the driving current is appropriately limited using the current adjusting unit connected between the connection node between the current controlling unit and the ground and the bias controlling unit, thereby making it possible to stably control the current supplied to the power amplifier.

Therefore, the efficiency of the power amplifier system may be increased.

Although the present invention has been shown and described with the exemplary embodiment as described above, the present invention is not limited to the exemplary embodiment as described above, but may be variously changed and modified by those skilled in the art to which the present invention pertains without departing from the scope of the present invention.

What is claimed is:

1. A power amplifier system comprising:
   a power amplifier;
   a power controlling unit providing a driving voltage and a driving current corresponding to a preset reference voltage to the power amplifier;
   a current controlling unit performing a control so that a control current corresponding to an applied control voltage flows;
   a bias controlling unit detecting a current and a voltage corresponding to the driving current of the power controlling unit and controlling a bias current of the power amplifier according to the detected voltage; and
   a current adjusting unit detecting a bias voltage corresponding to the bias current of the power amplifier and generating a feedback current according to the detected bias voltage and adjusting the driving current of the power controlling unit according to the feedback current.

2. The power amplifier system according to claim 1, wherein the current adjusting unit includes:
   a voltage divider dividing the detected bias voltage;
   a current adjusting transistor operated according to the detected bias voltage divided in the voltage divider; and
   a current mirror generating a mirror current that is the same as a current flowing to the current adjusting transistor.

3. The power amplifier system according to claim 1, wherein the bias controlling unit detects the current and the voltage corresponding to the driving current of the power controlling unit and controls the bias current so that the detected voltage, detected by the bias controlling unit, becomes equal to the driving voltage, provided by the power controlling unit.

4. The power amplifier system according to claim 1, wherein the bias controlling unit includes:
   a detector detecting a current corresponding to the driving current of the power controlling unit and detecting a voltage corresponding to the driving voltage of the power controlling unit;
   a bias control amplifier comparing the driving voltage, provided by the power controlling unit, and the detected voltage detected in the detector with each other, and outputting a difference voltage between the driving voltage, provided by the power controlling unit, and the detected voltage detected in the detector as a result of the comparison; and
   a first bias transistor and a second bias transistor operated according to the difference voltage output from the bias control amplifier.

5. The power amplifier system according to claim 2, wherein the bias controlling unit includes:
   a detector detecting a current corresponding to the driving current of the power controlling unit and detecting a voltage corresponding to the driving voltage of the power controlling unit;
   a bias control amplifier comparing the driving voltage of the power controlling unit and the detected voltage detected in the detector with each other and outputting a difference voltage between the driving voltage and the detected voltage detected in the detector as a result of the comparison; and
   a first bias transistor and a second bias transistor operated according to the outputted difference voltage from the bias control amplifier.

6. The power amplifier system according to claim 1, wherein the power controlling unit includes:
   a power control transistor having a source connected to a power supply terminal, a gate, and a drain connected to the current controlling unit; and
   a power control error amplifier including an inverting input terminal receiving the preset reference voltage, a non-inverting input terminal connected to the drain of the power control transistor through a first resistor and connected to a ground through a second resistor, and an output terminal connected to the gate of the power control transistor to provide a gate voltage.

7. The power amplifier system according to claim 4, wherein the bias voltage corresponding to the bias current of the power amplifier is voltage applied to a connection node between the first bias transistor and the second bias transistor.

8. The power amplifier system according to claim 2, wherein the current mirror is connected between the current controlling unit and a ground.

9. The power amplifier system according to claim 2, wherein the voltage divider includes:
   a first dividing resistor having one end connected to a connection node between the first bias transistor and the second bias transistor; and
   a second dividing resistor having one end connected to an other end of the first dividing resistor and the other end connected to a ground.

10. The power amplifier system according to claim 9, wherein the current adjusting transistor has a gate connected to a connection node between the first dividing resistor and the second dividing resistor, a source connected to the current mirror, and a drain connected to the ground.

11. The power amplifier system according to claim 2, wherein the control current corresponds to a sum of the driving current and the mirror current.

* * * * *